United States Patent
Weng

(10) Patent No.: US 6,812,124 B2
(45) Date of Patent: Nov. 2, 2004

(54) CHIP STRUCTURE WITH BUMPS AND A PROCESS FOR FABRICATING THE SAME

(75) Inventor: Chao-Fu Weng, Tainan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/065,632

(22) Filed: Nov. 5, 2002

(65) Prior Publication Data

US 2003/0127730 A1 Jul. 10, 2003

(30) Foreign Application Priority Data

Jan. 7, 2002 (TW) ........................................ 91100094 A

(51) Int. Cl.⁷ .............................................. H01L 21/44
(52) U.S. Cl. ....................... 438/613; 257/734; 257/735; 257/737
(58) Field of Search ................................ 257/734–739, 257/740–741, 750, 766; 438/613, 688, 652

(56) References Cited

U.S. PATENT DOCUMENTS

2002/0017711 A1 * 2/2002 Kwon et al. ................ 257/690
2002/0093096 A1 * 7/2002 Tago et al. .................. 257/738
2002/0180064 A1 * 12/2002 Hwan et al. ................. 257/780
2002/0185733 A1 * 12/2002 Chow et al. ................. 257/737
2002/0190395 A1 * 12/2002 Fang et al. .................. 257/784
2003/0067073 A1 * 4/2003 Akram et al. ................ 257/738

* cited by examiner

Primary Examiner—Long Pham
Assistant Examiner—Nathan W. Ha
(74) Attorney, Agent, or Firm—Jiang Chyun IP Office

(57) ABSTRACT

A chip structure with bumps comprising: a chip and at least a bump. The chip has an active surface and at least a bonding pad that is formed on the active surface. The bump is disposed on the bonding pad, and the bump comprises a medium layer, a bump body and a bump body passivation layer. The medium layer whose material includes zinc is disposed on the bonding pad. The bump body whose material includes nickel is disposed on the medium layer. The bump body passivation layer whose material includes gold covers the bump body except for a portion of the bump body that connects to the medium layer.

5 Claims, 5 Drawing Sheets

US 6,812,124 B2

CHIP STRUCTURE WITH BUMPS AND A PROCESS FOR FABRICATING THE SAME

CROSS REFERENCE TO RELATED APPLICATIONS

This application claims the priority benefit of Taiwan application serial no. 91100094, filed on Jan. 7, 2002.

BACKGROUND OF INVENTION

1. Field of the Invention

This invention relates in general to a chip structure with bumps and a process for fabricating the chip, and more specifically relates to bumps made of specific material so that the bumping process is simplified and the manufacturing cost is reduced.

2. Description of Related Art

Recently, following the high-development of information technology, electronic products are commonly used in the public. The design fashions of various electronic products trends also generally towards lightness, thinness, shortness and smallness. Therefore, as far as the field of semiconductor packages is concerned, a lot of package structures are provided in high density type. In some fields of package, bumps are formed on a chip to perform Flip Chip Packaging or Tape Carrier Packaging. Bumps are generally divided into 2 types, one is made of solder, the other is made of gold. The bumps made of gold in prior art will be described as follows.

FIG. 1 to FIG. 5 are schematic cross-sectional views showing the progression of steps for producing a bump made of gold in accordance with a conventional method.

As shown in FIG. 1, a chip 110 which has an active surface 112 and bonding pads 116 (only one bonding pad is shown) is provided. The bonding pads 116 are formed on the active surface. A passivation layer 114 is formed on the active surface 112 and a1a1 exposes the bonding pads 116 so that the chip 110 is electrically connected to other outside circuit (not shown) through the bonding pads 116. The Under Bump Metal process is followed to form a barrier layer 120 on the active surface 112 of the chip 110 by sputtering method. The barrier layer 120 covers bonding pads 116 and the passivation layer 114. The material of the barrier layer 120 is for example TiW etc., wherein a thickness of the barrier is about thousands of angstrom. Then a seed layer 130 is formed on the barrier layer 120 by electrical plating or sputtering method. After that, the Under Bump Metal 140 is completed. The material of seed layer 130 is for example gold, wherein a thickness of the seed layer is about 1000 angstrom, and the Under Bump Metal 140 is composed of the barrier layer 120 and seed layer 130.

As shown in FIG. 2, a photolithography process is performed. A photo resist layer 150 is formed on the seed layer 130. After the photo resist layer 150 has been exposed and developed, a pattern (not shown) is transferred to the photo resist layer 150 so that openings 152 (only one opening is shown) which exposes bonding pads 116 are formed in the photo resist layer 150.

As shown in FIG. 3, a bumping process follows. Bumps 160 (only one bump is shown) are filled in the openings 152 of the photo resist layer 150, wherein the material of the bump 160 is gold.

Referring to FIG. 3 and FIG. 4, the photo resist layer 150 is removed from the surface of the seed layer 130.

Referring to FIG. 4 and FIG. 5, the Under Bump Metal 140 which is exposed is removed by an etching method.

Then an annealing process is performed so that the metal ions with defects which are in the bumps 160 are rearranged to be in a stable state.

As it is described above, the bumping process is complicated, high cost and is not so effective a manufacturing process.

SUMMARY OF INVENTION

According to the foregoing description, an object of this invention is to provide a structure and a fabricating process of a bump so that the bumping process is simplified and cost down by changing the material of the bumps.

To attain the foregoing and other aspects, the present invention proposes a chip structure with bumps comprising: a chip and at least a bump. Wherein the chip has an active surface and at least a bonding pad, and the bonding pad is formed on the active surface. The bump is disposed on the bonding pad, and the bump comprises a medium layer, a bump body and a bump body passivation layer. The medium layer is disposed on the bonding pad, and a material of the medium layer includes zinc. A bump body is disposed on the medium layer, and a material of the bump body includes nickel. A bump body passivation layer covers the bump body except for a portion of the bump body that connects to the medium layer, wherein a material of the bump body passivation layer includes gold.

Also to attain the foregoing and other aspects, the present invention proposes a process for fabricating a chip with bumps comprising the following steps. First providing a chip that has an active surface and at least a bonding pad, wherein the bonding pad exposes the active surface. Then performing an activation step, depositing a medium layer on the bonding pad. Forming at least a bump body on the medium layer in an electroless plating way, and forming a bump body passivation layer covering the bump body except for a portion of the bump body that connects to the medium layer.

According to a preferred embodiment of the present invention, the material of the bump body is nickel, and the material of the bump body passivation layer is gold. The height of the bump body is about 5 to 10 microns, and the height of the bump body passivation layer is about 1 to 3 microns. The bump body and the bump body passivation layer are formed by electroless plating.

As it is described above, the feature of the present invention is to change the material of the bumps so that the bumps can be formed on the bonding pads of a chip in a simplified manufacturing process.

BRIEF DESCRIPTION OF DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings in which:

DETAILED DESCRIPTION

Figure 1:
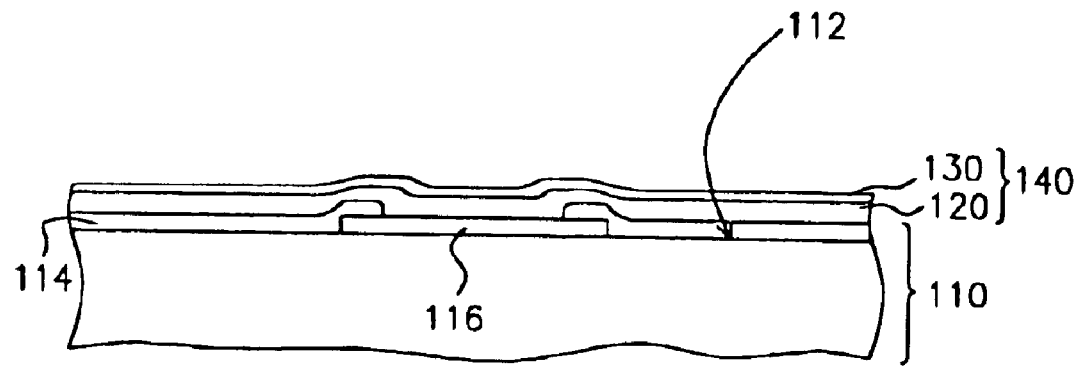
FIG. 1 through FIG. 5 are schematic cross-sectional views showing the progression of steps for producing a bump made of gold in accordance with a conventional method.
Figure 2:
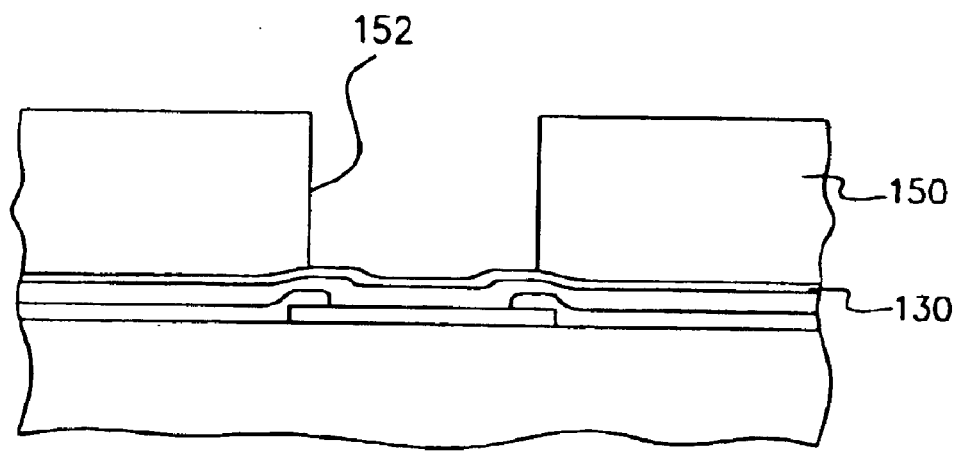
Figure 3:
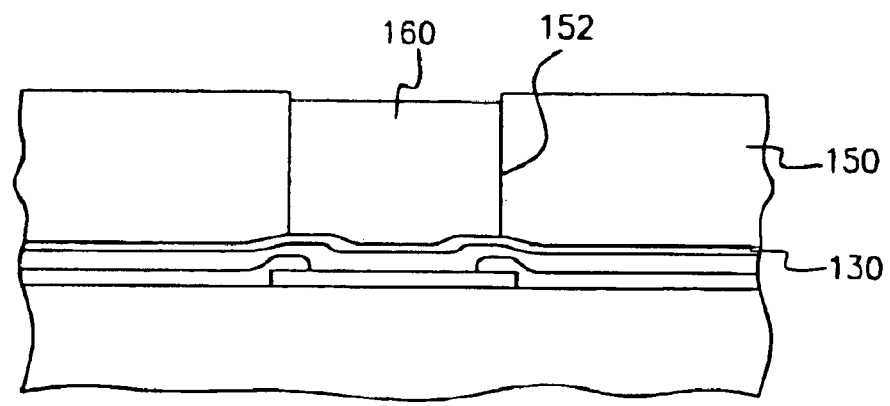
Figure 4:
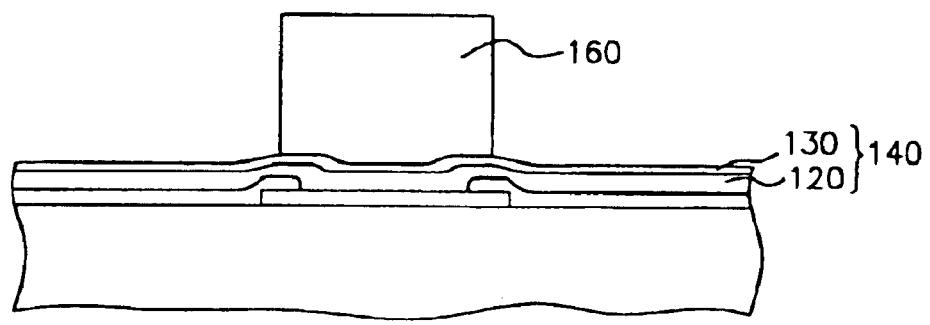
Figure 5:
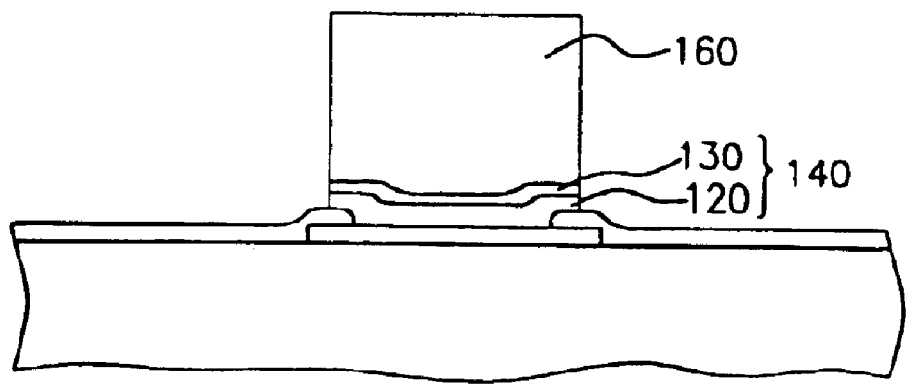
Figure 6:
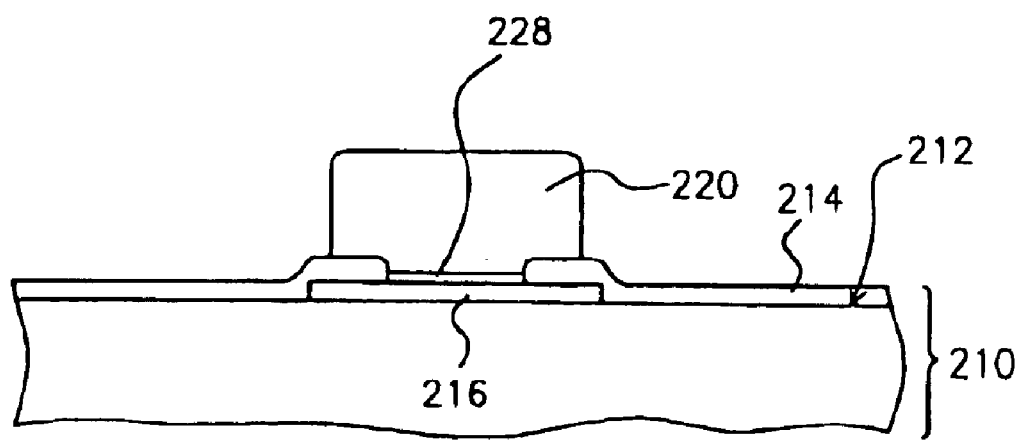
FIG. 6 and FIG. 7 are schematic cross-sectional views showing the progression of steps for producing a bump in accordance with a preferred embodiment of the present invention.
Figure 7:
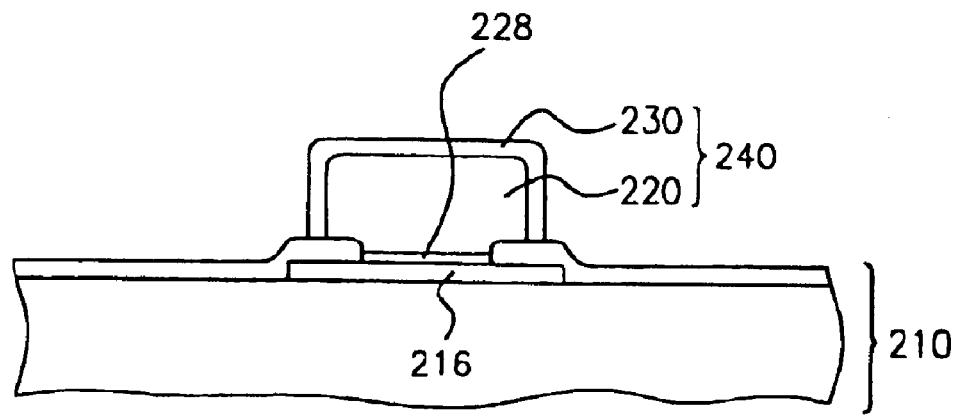

FIG. 6 and FIG. 7 are schematic cross-sectional views showing the progression of steps for producing a bump in accordance with a preferred embodiment of the present invention.

With reference to FIG. 6, a chip 210 which has an active surface 212 and at least a bonding pad 216 (only one bonding pad is shown) is provided. The bonding pad 216 is formed on the active surface 212. A passivation layer 214 is formed on the active surface 212 and exposes the bonding pad 216 so that the chip 210 is electrically connected to other outside circuit (not shown) through the bonding pad 216.

A bumping process which includes steps of producing a bump body and a bump body passivation layer follows. In the step of producing a bump body, at least a bump body 220 is formed by electroless plating to be electrically connected to the bonding pad 216. It is accomplished by following steps. First, an activation step is performed. During the activation step, the chip 210 is dipped into a zinc ions containing solution, then zinc is deposited on the bonding pad 216 of the chip 210 to form a medium layer 228, wherein a material of the medium layer includes zinc. Since zinc is utilized to be an activator before the following electroless plating, the deposition thickness of zinc doesn't need to be thick. Then an electroless plating step is performed. The chip 210 is dipped into a nickel ions containing solution, then nickel is formed on the medium layer 228 on the chip 210 in an electroless plating way. Nickel is deposited on zinc so that a bump body 220 is formed. The size of the bump body 220 can be controlled by the dipping time in nickel ions containing solution. Therefore, the bump body 220 is connected to the bonding pad 216 through the medium layer 228, wherein a material of the bump body 220 includes nickel.

With reference to FIG. 7, a step of producing a bump body passivation is performed.

A bump body passivation 230 is formed to cover the bump body 220 except for a portion of the bump body 220 that connects to the medium layer 228. The material of the bump body passivation layer 230 is gold so that the oxidization of the bump body 220 (nickel) can be prevented. After these steps, the bump 240, which comprises the bump body 220 and the bump body passivation layer 230, is accomplished. Since the hardness of the bump body 220 whose material is nickel is relatively high, the height of the bump 240 only needs to be 5 to 10 microns to perform the Tape Carrier Packing process. The thickness of the bump body passivation layer 230 is about 1 to 3 microns.

Comparing this preferred embodiment with the prior art, the bumping process described above can eliminate the Under Bump Metal process, photolithography and etching process. Furthermore, it is not necessary to form the bump using electrical plating. Therefore, the bumping process of the present invention is simplified and the manufacturing cost is down.

Figure 8:
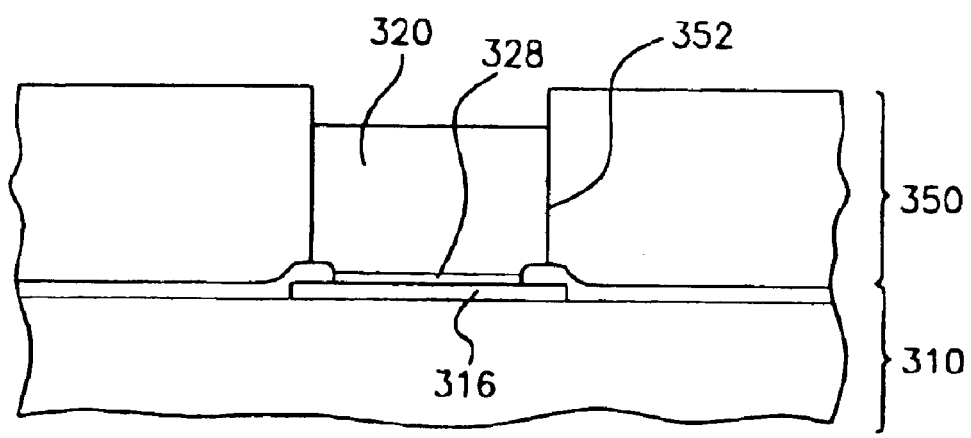
FIG. 8 through FIG. 10 are schematic cross-sectional views showing the progression of steps for producing a bump in accordance with another preferred embodiment of the present invention.
Figure 9:
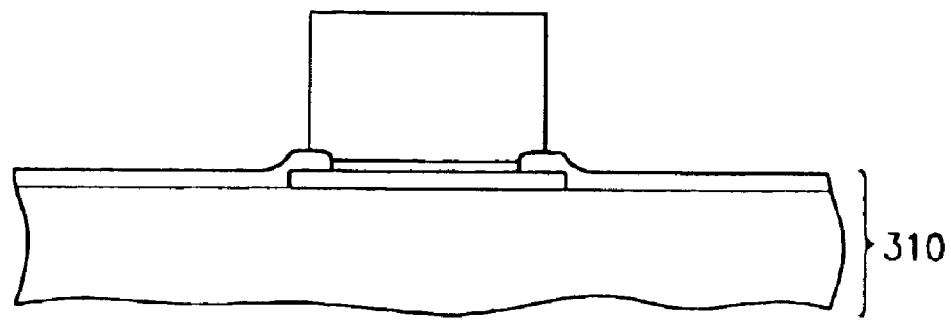
Figure 10:
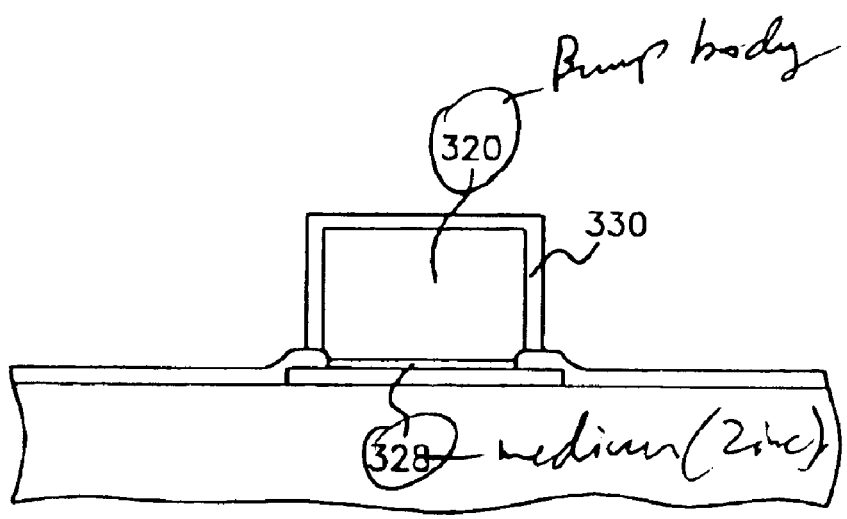

FIG. 8 through FIG. 10 are schematic cross-sectional views showing the progression of steps for producing a bump in accordance with another preferred embodiment of the present invention. In the previous embodiment, the bump body is formed on a chip in an electroless plating way. Furthermore, a photolithography process can also be added to control the shape of the bump.

With reference to FIG. 8, a photolithography process is performed after a chip 310 is provided.

First a photo resist layer 350 is formed on the chip 310. After the photo resist layer 350 has been exposed and developed, a pattern (not shown) is transferred to the photo resist layer 350 so that at least an opening 352 (only one opening is shown), which exposes bonding pad 316, is formed in the photo resist layer 350. An activation step is followed to form a medium layer 328, zinc, on the bonding pad 316 of the chip 310. Then a bump body 320, nickel, is formed on the medium layer 328 inside the opening by electroless plating.

With reference to FIG. 8 and FIG. 9, the photo resist layer 350 is removed form the surface of the chip 310.

With reference to FIG. 10, finally, a step of producing a bump body passivation layer is performed. A bump body passivation layer 330, gold is formed to cover the bump body 320 except for a portion of the bump body 320 that connects to the medium layer 328.

With reference to FIG. 8, since the bump body 320 is formed inside the opening 352, the shape of the bump body 320 can be controlled by the shapes of the openings 352. Accordingly, the bump body 320 can be formed higher than that in the previous embodiment.

As it is described above, the structure and the fabricating process of the bump in the present invention can simplify the bumping process and can reduce the manufacturing cost.

While the present invention has been described with 2 preferred embodiments, these descriptions are not intended to limit our invention. Various modifications of the embodiments will be apparent to those skilled in the art. It is therefore contemplated that the appended claims will cover any such modifications or embodiments as fall within the true scope of the invention.

What is claimed is:

1. A process for fabricating a bump, wherein the bump is disposed on a chip that has an active surface and at least a bonding pad, the process comprising:

forming a photoresist layer over the active surface of the chip, having at least an opening that exposes the bonding pad;

performing an activation step, for depositing a medium layer directly on the bonding pad in the opening of the photoresist layer;

performing an electroless plating process for forming a conductive layer within the opening of the photoresist layer, so that at least a bump body is formed inside the opening and directly in contact with the medium layer; and removing the photoresist layer.

2. The process of claim 1, wherein a material of the bump body is nickel.

3. The process of claim 1, wherein a material of the medium layer is zinc.

4. The process of claim 1, after forming the bump body, further comprising forming a bump body passivation layer on the bump body covering the bump body except for a portion of the bump body that connects to the medium layer.

5. The process of claim 4, wherein a material of the bump body passivation layer is gold.

* * * * *